US012158609B2

(12) United States Patent
Hiratani

(10) Patent No.: US 12,158,609 B2
(45) Date of Patent: Dec. 3, 2024

(54) SEMICONDUCTOR OPTICAL DEVICE AND METHOD FOR MANUFACTURING THE SAME

(71) Applicant: Sumitomo Electric Industries, Ltd., Osaka (JP)

(72) Inventor: Takuo Hiratani, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 549 days.

(21) Appl. No.: 17/524,634

(22) Filed: Nov. 11, 2021

(65) Prior Publication Data

US 2022/0206226 A1 Jun. 30, 2022

(30) Foreign Application Priority Data

Dec. 24, 2020 (JP) ................................ 2020-214662
Jan. 28, 2021 (JP) ................................ 2021-011621

(51) Int. Cl.
*G02B 6/293* (2006.01)
*H01S 5/12* (2021.01)
*H01S 5/32* (2006.01)

(52) U.S. Cl.
CPC ........ *G02B 6/29316* (2013.01); *H01S 5/1228* (2013.01); *H01S 5/3211* (2013.01)

(58) Field of Classification Search
CPC ................................................. G02B 6/29316
See application file for complete search history.

(56) References Cited

U.S. PATENT DOCUMENTS

2016/0327759 A1* 11/2016 Keyvaninia ......... H01L 31/1035
2017/0098922 A1* 4/2017 Hatori ................. H04B 10/501

FOREIGN PATENT DOCUMENTS

JP 2005175450 A 6/2005
JP 2017069494 A 4/2017
WO 2016076793 A1 5/2016

OTHER PUBLICATIONS

Amin Abbasi et al. “43 Gb/s NRZ-OOK Direct Modulation of a Heterogeneously Integrated InP/Si DFB Laser” Journal of Lightwave Technology, vol. 35, No. 6, Mar. 15, 2017.

* cited by examiner

*Primary Examiner* — Tuan N Nguyen
(74) *Attorney, Agent, or Firm* — Volpe Koenig

(57) ABSTRACT

A semiconductor optical device includes a substrate containing silicon and including terraces, a waveguide, and a diffraction grating in different regions in plan view; and a semiconductor device formed of a III-V compound semiconductor and having an optical gain, the semiconductor device being joined to the diffraction grating and the terraces and being in contact with an upper surface of the substrate. The waveguide is optically coupled to the diffraction grating in a direction in which the waveguide extends. The terraces are located on both sides of the waveguide and the diffraction grating in a direction crossing the direction in which the waveguide extends. The substrate has a groove between each of the terraces and the waveguide. The diffraction grating is continuously connected to the terraces in the direction crossing the direction in which the waveguide extends.

8 Claims, 17 Drawing Sheets

10, 46
C
D
38
B
A
26
40
30
42
100
24
22
20
21
22
24
43
39
37
44
39
43
Y
Z
X

SEMICONDUCTOR OPTICAL DEVICE AND METHOD FOR MANUFACTURING THE SAME

CROSS REFERENCES TO RELATED APPLICATIONS

This application claims priority based on Japanese Patent Applications No. 2020-214662, filed on Dec. 24, 2020, and No. 2021-011621, filed on Jan. 28, 2021, and the entire contents of the Japanese patent applications are incorporated herein by reference.

BACKGROUND OF THE INVENTION

1. Field of the Invention

The present disclosure relates to a semiconductor optical device and a method for manufacturing the semiconductor optical device.

2. Description of the Related Art

A technology for joining a semiconductor device formed of a compound semiconductor and having an optical gain to a substrate, such as a silicon-on-insulator (SOI) substrate having waveguides formed thereon (silicon photonics) is known (refer to, for example, Amin Abbasi et al. "43 Gb/s NRZ-OOK Direct Modulation of a Heterogeneously Integrated InP/Si DFB Laser" JOURNAL OF LIGHTWAVE TECHNOLOGY, VOL. 35, NO. 6, Mar. 15, 2017).

A distributed feedback (DFB) laser device is formed by forming a waveguide, a diffraction grating, etc. on a substrate and joining a semiconductor device having an optical gain to the diffraction grating.

When an intermediate layer made of a resin, for example, is provided between the substrate and the semiconductor device, the thermal resistance is increased. The temperature easily increases during operation, and the characteristics are degraded. When the substrate and the semiconductor device are directly joined together without an intermediate layer therebetween, the contact area between the substrate and the semiconductor device is reduced because the substrate has grooves. Accordingly, the joining strength is reduced. In addition, since the grooves in the substrate are filled with air, the thermal resistance is increased.

SUMMARY OF THE INVENTION

Accordingly, it is an object of the present disclosure to provide a semiconductor optical device in which the thermal resistance can be reduced and the joining strength can be increased and a method for manufacturing the semiconductor optical device.

A semiconductor optical device according to the present disclosure includes a substrate containing silicon and including terraces, a waveguide, and a diffraction grating in different regions in plan view; and a semiconductor device formed of a III-V compound semiconductor and having an optical gain, the semiconductor device being joined to the diffraction grating and the terraces and being in contact with an upper surface of the substrate. The waveguide is optically coupled to the diffraction grating in a direction in which the waveguide extends. The terraces are located on both sides of the waveguide and the diffraction grating in a direction crossing the direction in which the waveguide extends. The substrate has a groove between each of the terraces and the waveguide. The diffraction grating is continuously connected to the terraces in the direction crossing the direction in which the waveguide extends.

A method for manufacturing a semiconductor optical device according to the present disclosure includes the steps of preparing a substrate containing silicon and having terraces, a waveguide, and a diffraction grating formed thereon in different regions in plan view; and joining a semiconductor device formed of a III-V compound semiconductor and having an optical gain to the diffraction grating and the terraces on the substrate. The joining of the semiconductor device is performed such that the semiconductor device comes into contact with an upper surface of the substrate. The waveguide is optically coupled to the diffraction grating in a direction in which the waveguide extends. The terraces are located on both sides of the waveguide and the diffraction grating in a direction crossing the direction in which the waveguide extends. The substrate has a groove between each of the terraces and the waveguide. The diffraction grating is continuously connected to the terraces in the direction crossing the direction in which the waveguide extends.

DESCRIPTION OF THE PREFERRED EMBODIMENTS

Description of Embodiments of Present Disclosure

Figure 1A:
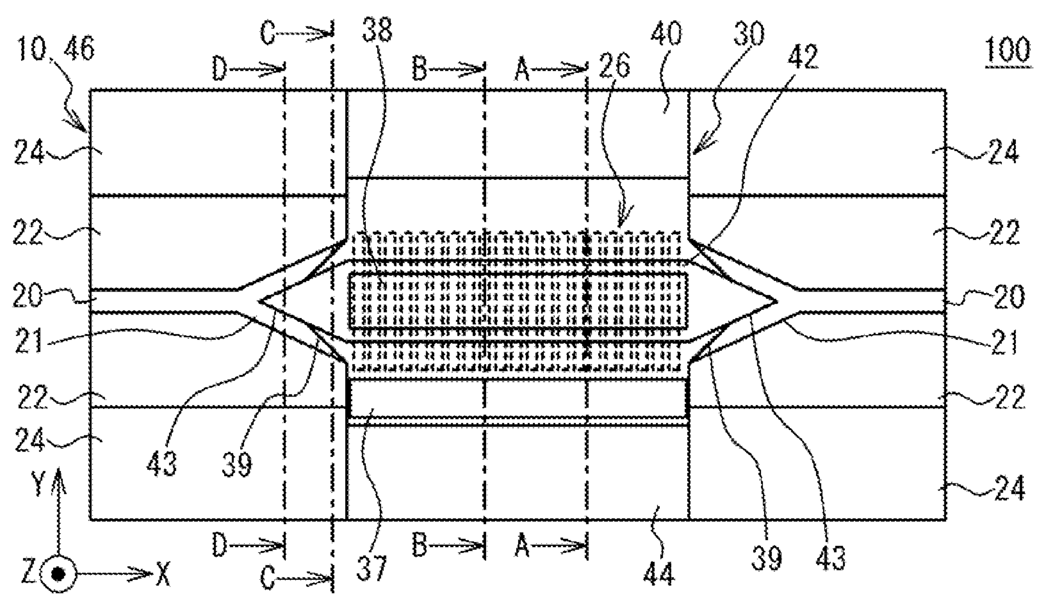
FIG. 1A is a plan view illustrating a semiconductor optical device according to an embodiment.

Embodiments of the present disclosure will now be described.

According to one embodiment of the present disclosure, (1) a semiconductor optical device includes a substrate containing silicon and including terraces, a waveguide, and a diffraction grating in different regions in plan view; and a semiconductor device formed of a III-V compound semiconductor and having an optical gain, the semiconductor device being joined to the diffraction grating and the terraces and being in contact with an upper surface of the substrate. The waveguide is optically coupled to the diffraction grating in a direction in which the waveguide extends. The terraces are located on both sides of the waveguide and the diffraction grating in a direction crossing the direction in which the waveguide extends. The substrate has a groove between each of the terraces and the waveguide. The diffraction grating is continuously connected to the terraces in the direction crossing the direction in which the waveguide extends. Since the contact area between the semiconductor device and the substrate is increased, the joining strength is increased, and the thermal resistance is reduced.

(2) The substrate may include a silicon layer, and the terraces, the waveguide, and the diffraction grating may be provided on or in the silicon layer. The diffraction grating may include recesses and projections that are provided on or in the silicon layer and arranged periodically in the direction in which the waveguide extends. Upper surfaces of the terraces and upper surfaces of the projections of the diffraction grating may form a plane. Since the semiconductor device is in contact with the terraces and the projections, the joining strength is increased, and the thermal resistance is reduced.

(3) The semiconductor device may include a first cladding layer, an active layer, and a second cladding layer that are stacked in that order from the substrate, and may also include a first mesa that is provided above the diffraction grating and that projects from the substrate in a direction away from the substrate. The first mesa may include a portion of the second cladding layer. Since the semiconductor device includes the first mesa, the effect of confining light in the semiconductor device is enhanced. Accordingly, leakage of light to the substrate is reduced, and the light mode can be controlled.

(4) The diffraction grating may have a width greater than a width of the first mesa in the direction crossing the direction in which the waveguide extends. Since the terraces are separated from the first mesa, the effect of confining light in the semiconductor device is enhanced. Accordingly, leakage of light to the substrate is reduced.

(5) The semiconductor device may include second mesas that are provided above the terraces of the substrate and that project from the substrate in the direction away from the substrate. Each second mesa may include a portion of the second cladding layer and be separated from the first mesa. The semiconductor device may include a first electrode that is electrically connected to the first cladding layer and a second electrode that is electrically connected to the portion of the second cladding layer included in the first mesa. The effect of confining light in a portion of the active layer positioned below the first mesa is enhanced. Accordingly, leakage of light to the substrate is reduced, and the light mode can be controlled.

(6) The terraces include protruding portions that protrude toward the diffraction grating. The diffraction grating may be connected to the protruding portions. Since the contact area between the semiconductor device and the substrate is increased, the joining strength is increased, and the thermal resistance is reduced.

(7) The waveguide may include a first tapered portion having a width that decreases with increasing distance from the diffraction grating in a direction away from the diffraction grating. In such a case, the light loss may be reduced.

(8) The semiconductor device may include a second tapered portion having a width that decreases with increasing distance from the diffraction grating in a direction toward the waveguide. In such a case, the optical coupling between the semiconductor device and the substrate is enhanced, and the light loss may be reduced.

(9) A method for manufacturing a semiconductor optical device, the method includes the steps of preparing a substrate containing silicon and having terraces, a waveguide, and a diffraction grating formed thereon in different regions in plan view; and joining a semiconductor device formed of a III-V compound semiconductor and having an optical gain to the diffraction grating and the terraces on the substrate. The joining of the semiconductor device is performed such that the semiconductor device comes into contact with an upper surface of the substrate. The waveguide is optically coupled to the diffraction grating in a direction in which the waveguide extends. The terraces are located on both sides of the waveguide and the diffraction grating in a direction crossing the direction in which the waveguide extends. The substrate has a groove between each of the terraces and the waveguide. The diffraction grating is continuously connected to the terraces in the direction crossing the direction in which the waveguide extends. Since the contact area between the semiconductor device and the substrate is increased, the joining strength is increased, and the thermal resistance is reduced.

Detailed Description of Embodiments of Present Disclosure

Examples of a semiconductor optical device and a method for manufacturing the semiconductor optical device according to an embodiment of the present disclosure will now be described with reference to the drawings. The present disclosure is not limited to these examples, but is defined by the scope of the claims and intended to include equivalents to the scope of the claims and all modifications within the scope.

Figure 1B:
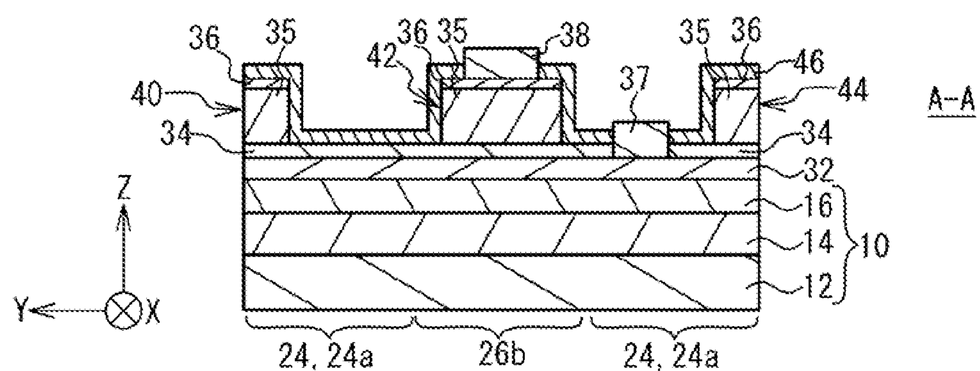
FIG. 1B is a sectional view of FIG. 1A taken along line A-A.
Figure 1C:
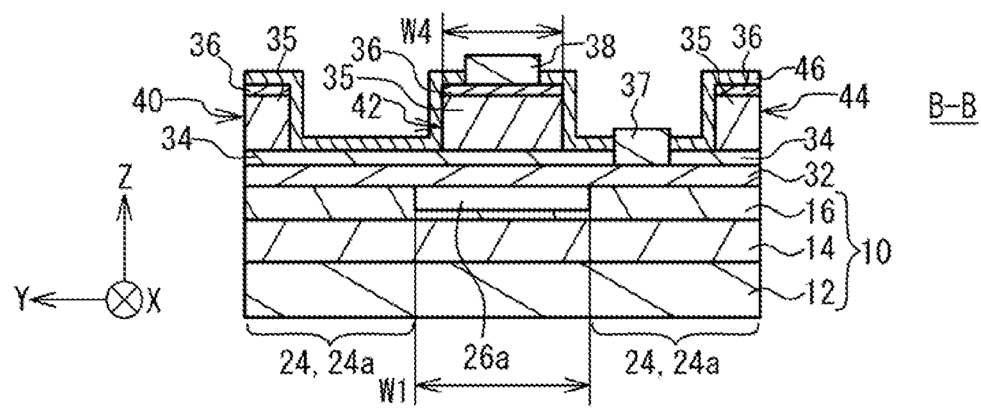
FIG. 1C is a sectional view of FIG. 1A taken along line B-B.
Figure 1D:
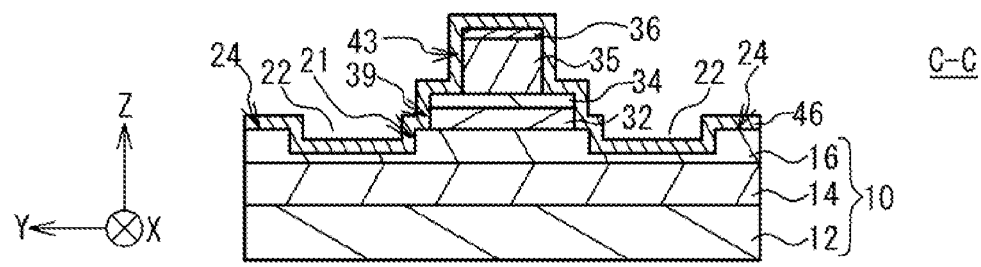
FIG. 1D is a sectional view of FIG. 1A taken along line C-C.
Figure 1E:
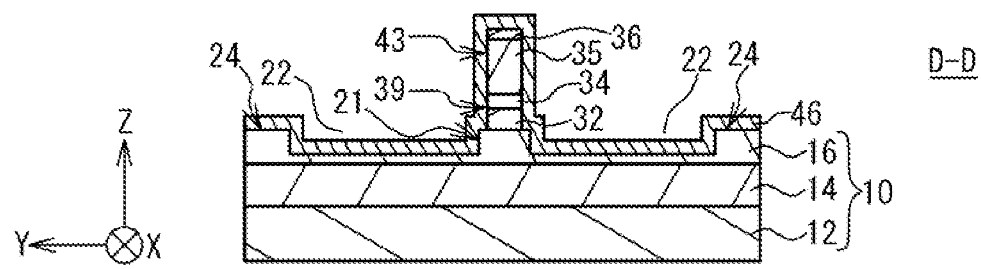
FIG. 1E is a sectional view of FIG. 1A taken along line D-D.
Figure 2:
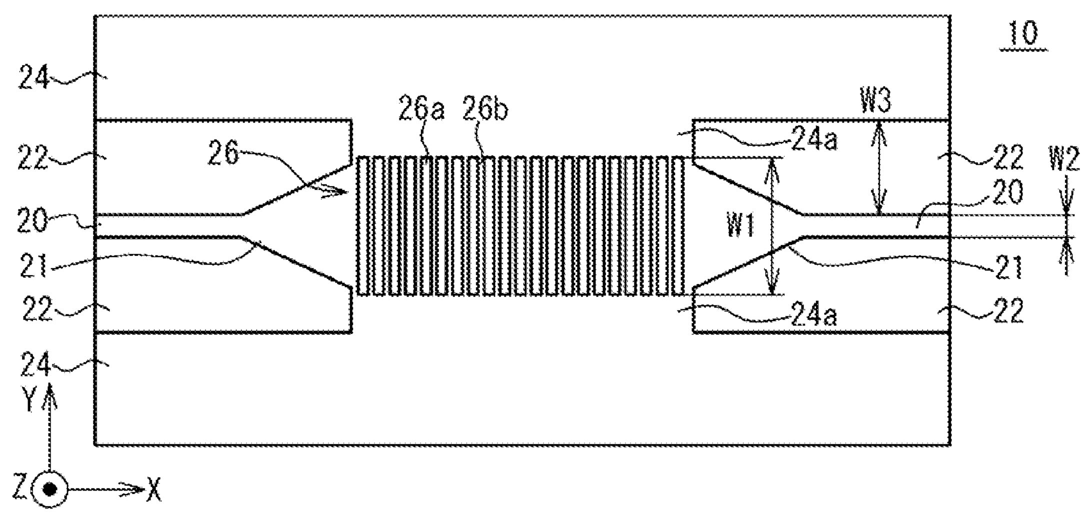
FIG. 2 is a plan view illustrating a substrate.

FIG. 1A is a plan view illustrating a semiconductor optical device 100 according to an embodiment. FIG. 1B is a sectional view of FIG. 1A taken along line A-A. FIG. 1C is a sectional view of FIG. 1A taken along line B-B. FIG. 1D is a sectional view of FIG. 1A taken along line C-C. FIG. 1E is a sectional view of FIG. 1A taken along line D-D. FIG. 2 is a plan view illustrating a substrate 10. As illustrated in FIGS. 1A to 1E, the semiconductor optical device 100 is a hybrid DFB laser device including the substrate 10 and a semiconductor device 30. The surfaces of the substrate 10 and the semiconductor device 30 are covered with an insulating film 46. In FIG. 1A, the insulating film 46 is illustrated in a see-through manner.

Substrate

As illustrated in FIGS. 1B to 1E, the substrate 10 is an SOI substrate including a silicon (Si) substrate 12, a silicon oxide ($SiO_2$) layer 14, and a Si layer 16 that are stacked in that order. End surfaces of the substrate 10 are coated to prevent reflection of light. The substrate 10 has sides extending in an X-axis direction and sides extending in a Y-axis direction. The substrate 12, the $SiO_2$ layer 14, and the Si layer 16 are stacked in a Z-axis direction. The X-axis direction, the Y-axis direction, and the Z-axis direction are orthogonal to each other.

As illustrated in FIGS. 1A and 2, the Si layer 16 of the substrate 10 has waveguides 20, grooves 22, terraces 24, and a diffraction grating 26. One of the waveguides 20, the diffraction grating 26, and another one of the waveguides 20 are arranged in that order from one end to the other end of the substrate 10 in the X-axis direction. The waveguides 20, which extend in the X-axis direction, are optically coupled to the diffraction grating 26 and have tapered portions 21 at locations where the waveguides 20 are coupled to the diffraction grating 26. Each tapered portion 21 has a width that increases toward the diffraction grating 26 and decreases with increasing distance from the diffraction grating 26 in the X-axis direction.

The Si layer 16 has a plurality of recesses 26*a* and a plurality of projections 26*b* that are arranged periodically in the X-axis direction in a region between the two tapered portions 21. Air in the recesses 26*a* and the projections 26*b* made of silicon have different refractive indices, so that the recesses 26*a* and the projections 26*b* function as the diffraction grating 26. In other words, the diffraction grating 26 includes the recesses 26*a* and the projections 26*b*. The semiconductor device 30 is joined to the diffraction grating 26.

The grooves 22 are provided on both sides of the waveguides 20 and the tapered portions 21 in the Y-axis direction. The terraces 24 are provided outside the grooves 22. The upper surfaces of the waveguides 20, the upper surfaces of the tapered portions 21, the upper surfaces of the terraces 24, and the upper surfaces of the projections 26*b* are at the same height in the Z-axis direction and are on the same plane.

The grooves 22 and the recesses 26*a* extend to an intermediate position of the Si layer 16 in the Z-axis direction. The bottom surfaces of the grooves 22 and the recesses 26*a*, which are formed of the Si layer 16, are at the same height in the Z-axis direction and positioned below the upper surfaces of the terraces 24 and the projections 26*b*. As illustrated in FIGS. 1D and 1E, the inner surfaces of the grooves 22 are covered with the insulating film 46. The recesses 26*a* are hollow.

As illustrated in FIGS. 1A and 2, no grooves 22 are provided between the diffraction grating 26 and the terraces 24. The diffraction grating 26 extends to the terraces 24 in the Y-axis direction, and are continuously connected to the terraces 24. More specifically, the terraces 24 include protruding portions 24*a* at positions where the terraces 24 face the diffraction grating 26 in the Y-axis direction. The protruding portions 24*a* protrude in the Y-axis direction and are connected to the diffraction grating 26. The projections 26*b* of the diffraction grating 26 extend to the protruding portions 24*a* of the terraces 24, and form the upper surface of the substrate 10 together with the protruding portions 24*a*. Both ends of each recess 26*a* of the diffraction grating 26 in the Y-axis direction reach the protruding portions 24*a*.

Referring to FIGS. 1C and 2, the diffraction grating 26 has a width W1 of, for example, 5 μm in the Y-axis direction. The width W1 of the diffraction grating 26 means the width of the recesses 26*a* and the projections 26*b*. Referring to FIG. 2, the waveguides 20 have a width W2 of, for example, 0.5 μm. The grooves 22 have a width W3 of, for example, 5 μm.

Semiconductor Device

The semiconductor device 30 illustrated in FIG. 1A is a light emitting element having a ridge mesa structure formed of a III-V compound semiconductor. As illustrated in FIGS. 1B to 1E, the semiconductor device 30 includes a cladding layer 32 (first cladding layer), an active layer 34, a cladding layer 35 (second cladding layer), and a contact layer 36 stacked on the substrate 10 in that order in the Z-axis direction.

The cladding layer 32 is made of, for example, n-type indium phosphide (n-InP). The cladding layer 35 is made of, for example, p-InP. The contact layer 36 is made of, for example, p-type indium gallium arsenide (p-InGaAs). The active layer 34 includes, for example, a plurality of well layers and a plurality of barrier layers made of undoped gallium indium arsenide phosphide (i-GaInAsP) and has a multi quantum well (MQW) structure. A spacer layer may be provided between the active layer 34 and the cladding layer 32 and between the active layer 34 and the cladding layer 35. The semiconductor device 30 may include an n-type contact layer (not illustrated) above the cladding layer 32 or be made of a semiconductor other than the above-described semiconductor.

The semiconductor device 30 includes three mesas 40, 42, and 44. The mesas 40, 42, and 44 are arranged in that order in the Y-axis direction, and are separated from each other. The mesas 40 and 44 (second mesas) are positioned above the terraces 24. The mesa 42 (first mesa) is positioned above the diffraction grating 26. As illustrated in FIGS. 1B and 1C, the mesas 40, 42, and 44 are formed of the cladding layer 35 and the contact layer 36, and project form the lower surface of the semiconductor device 30 (cladding layer 32) in a direction away from the substrate 10 (upward in the Z-axis direction). The cladding layer 32 and the active layer 34 extend from the mesa 40 to the mesa 44.

Referring to FIG. 1C, the mesa 42 has a width W4 less than the width W1 of the diffraction grating 26. For example, the width W4 is 2.5 μm. As illustrated in FIG. 1A, the length of the mesas 40 and 44 in the X-axis direction is, for example, substantially equal to the length of the diffraction grating 26. The length of the mesa 42 in the X-axis direction is greater than the length of the diffraction grating 26 and the mesas 40 and 44. The mesa 42 includes two tapered portions 43. The tapered portions 43 protrude from the diffraction grating 26 in the X-axis direction, and each have a width that decreases with increasing distance in a direction away from the diffraction grating 26.

As illustrated in FIGS. 1A, 1D, and 1E, the cladding layer 32 and the active layer 34 have two tapered portions 39. The tapered portions 39 are positioned above the tapered portions 21 of the substrate 10. The tapered portions 39 protrude from the diffraction grating 26 in the X-axis direction, and each have a width that decreases with increasing distance in a direction away from the diffraction grating 26. As illustrated in FIGS. 1D and 1E, each tapered portion 43 is positioned above a corresponding one of the tapered portions 39. As illustrated in FIG. 1E, the tapered portion 43 and the tapered portion 39 completely overlap at the pointed ends thereof. The length of the tapered portions 39 and 43 in the X-axis direction is less than the length of the tapered portions 21 of the substrate 10.

As illustrated in FIGS. 1B to 1E, the insulating film 46 covers the upper and side surfaces of the mesas 40, 42, and 44, the upper surfaces of portions of the active layer 34 between the mesas, and the upper surface of the substrate 10. The insulating film 46 is made of, for example, silicon oxide ($SiO_2$). The refractive index of the insulating film 46 is less than the refractive indices of the Si layer 16 and the mesa 42. Therefore, the insulating film 46 functions as cladding that confines light in the mesa 42 and the waveguides 20. As illustrated in FIG. 1B, an electrode 37, which is an n-type electrode, is disposed between the mesas 42 and 44, and is electrically connected to the cladding layer 32 through an opening in the insulating film 46. The electrode 37 includes an ohmic electrode layer made of an alloy of gold, germanium, and nickel (AuGeNi) and a wiring layer made of Au. An electrode 38, which is a p-type electrode, is provided on the upper surface of the mesa 42, and is electrically connected to the contact layer 36 and the cladding layer 35 through an opening in the insulating film 46. The electrode 38 includes an ohmic electrode layer composed of a multilayer body of titanium, platinum, and gold (Ti/Pt/Au) and a wiring layer made of Au.

The semiconductor device 30 has an optical gain. When a voltage is applied between the electrodes 37 and 38, a current flows through the mesa 42, and carriers are injected into the active layer 34. Accordingly, light is emitted from a portion of the active layer 34 that is below the mesa 42. The active layer 34 of the semiconductor device 30 and the diffraction grating 26 of the substrate 10 are evanescently optically coupled to each other. Light generated by the semiconductor device 30 propagates through the diffraction grating 26, the tapered portions 21, and the waveguides 20, and is emitted to the outside of the semiconductor optical device 100 from an end face of the substrate 10.

Since the grooves 22 are provided on both sides of the waveguides 20, light may be strongly confined in the waveguides 20 due to the difference in refractive index between the waveguides 20 composed of a Si layer and the insulating film 46 (or air) in the grooves 22. No grooves 22 are provided on both sides of the diffraction grating 26, and the diffraction grating 26 is connect to the protruding portions 24*a* of the terraces 24. The semiconductor device 30 has the ridge mesa structure in which the mesa 42 is disposed above the diffraction grating 26. According to the ridge mesa structure, light is strongly confined in a portion of the active layer 34 positioned below the mesa 42, and leakage of light to the Si layer 16 of the substrate 10 does not easily occur. Accordingly, light with desired mode distribution can be obtained.

Figure 3A:
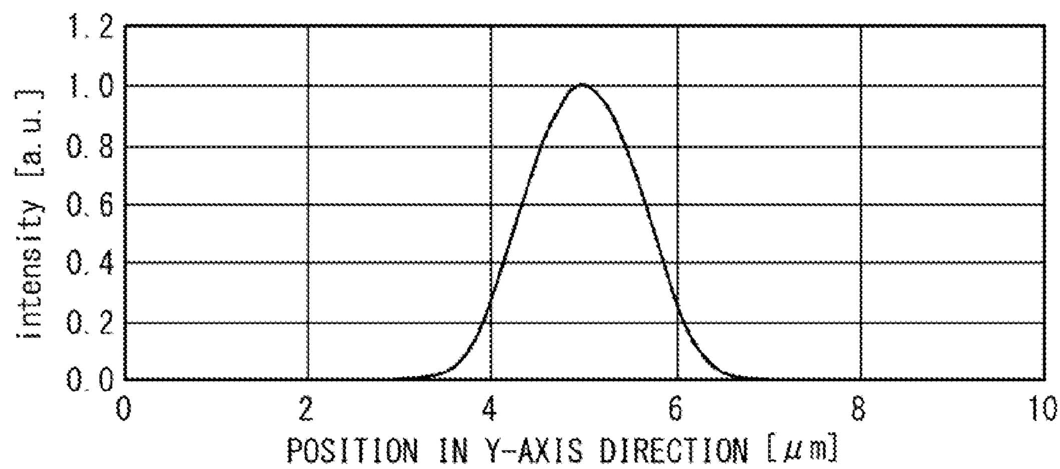
FIG. 3A is a graph showing the intensity of light.
Figure 3B:
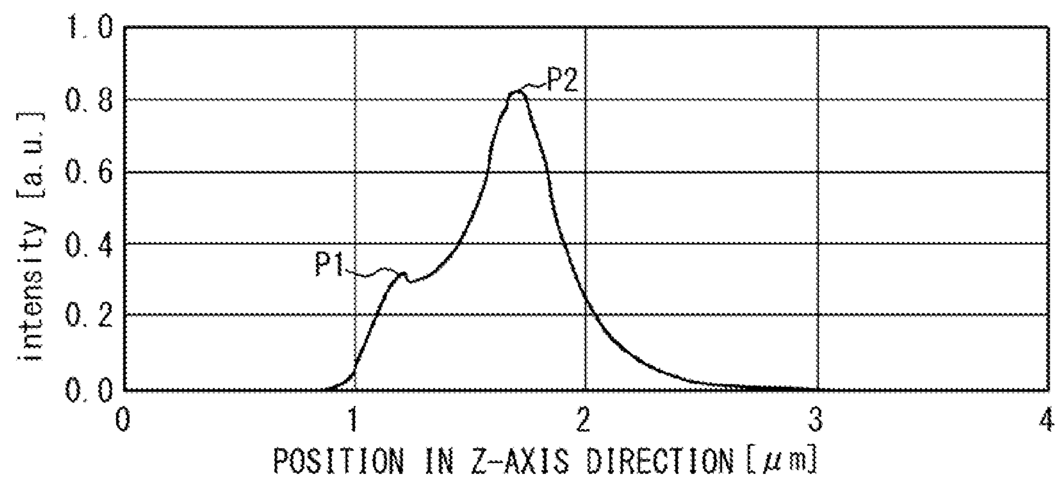
FIG. 3B is a graph showing the intensity of light.
Figure 4A:
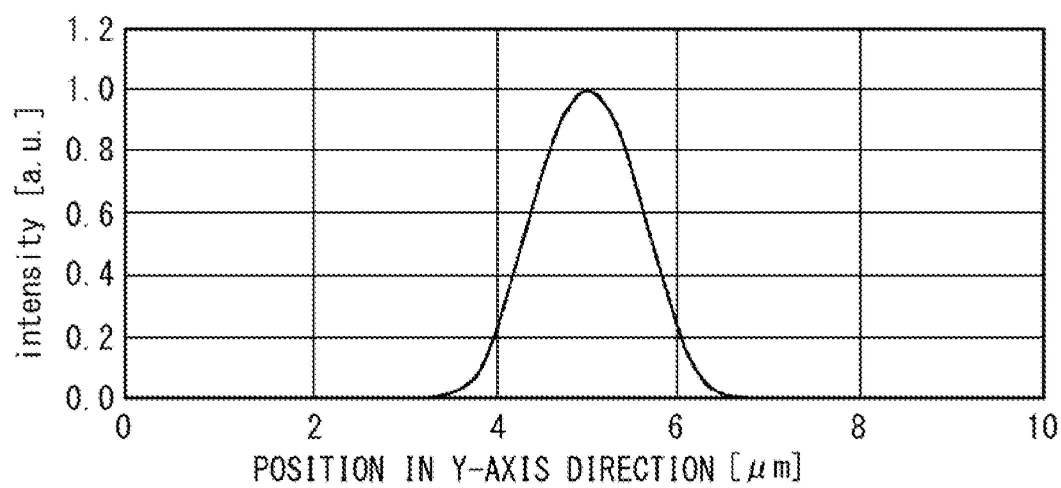
FIG. 4A is a graph showing the intensity of light.
Figure 4B:
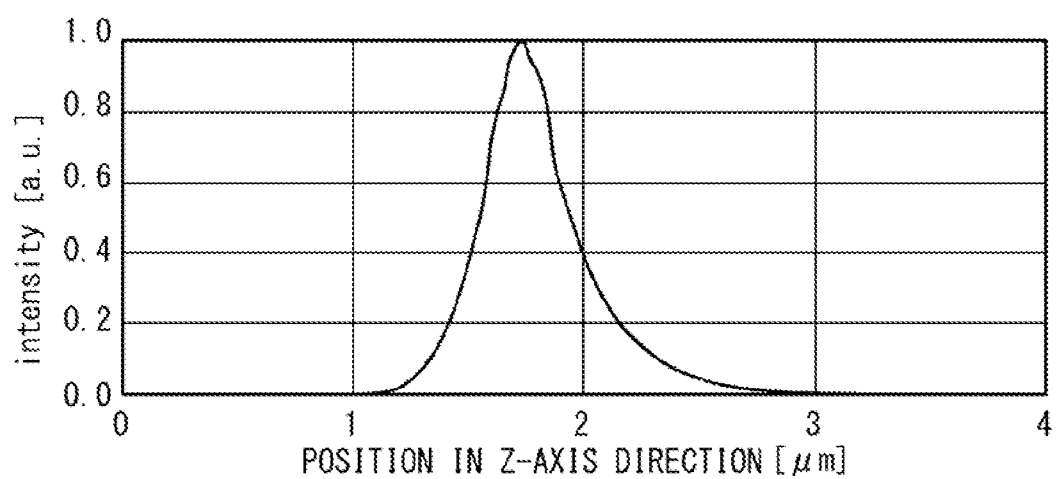
FIG. 4B is a graph showing the intensity of light.

FIGS. 3A to 4B are graphs showing the intensity of light. FIGS. 3A and 3B show the intensity of light on a cross section on which the semiconductor device 30 and one of the projections 26*b* of the diffraction grating 26 are aligned as illustrated in FIG. 1B. FIGS. 4A and 4B show the intensity of light on a cross section on which the semiconductor device 30 and one of the recesses 26*a* of the diffraction grating 26 are aligned as illustrated in FIG. 1C. In FIGS. 3A to 4B, the vertical axis represents the intensity of light.

In FIGS. 3A and 4A, the horizontal axis represents the position in the Y-axis direction. In other words, FIGS. 3A and 4A show the distributions of light in the Y-axis direction. The position of 5 μm in the Y-axis direction corresponds to the center of the mesa 42 in the width direction. As illustrated in FIGS. 3A and 4A, light is distributed over a range from 4 μm to 6 μm, and the peak intensity of light exists in this range. The light is concentrated in the central region in the Y-axis direction, that is, at the mesa 42. The width of the diffraction grating 26 is preferably greater than the range of light distribution in the Y-axis direction in FIGS. 3A and 4A. More specifically, the width of the diffraction grating 26 may be greater than or equal to twice the width of the mesa 42.

In FIGS. 3B and 4B, the horizontal axis represents the position in the Z-axis direction in a region including the mesa 42. In other words, FIGS. 3B and 4B show the distributions of light in the Z-axis direction. As illustrated in FIG. 3B, on the cross section including the projection 26*b*, light has two peaks P1 and P2. The peak P1 appears in the Si layer 16 of the substrate 10. The peak P2, which is greater than the peak P1, appears in the active layer 34 of the mesa 42. As illustrated in FIG. 4B, on the cross section including the recess 26*a*, light has a peak only in the active layer 34.

On the cross section including the projection 26*b*, a light confinement coefficient of the active layer 34 is 3.74%. Although light is distributed mainly in the active layer 34, leakage to the Si layer 16 also occurs, as illustrated in FIG. 3B. On the cross section including the recess 26*a*, the light confinement coefficient is 5.77%. As illustrated in FIGS. 4A and 4B, on the cross section including the recess 26*a*, light is more strongly confined in the active layer 34 than on the cross section including the projection 26*b*. When the diffraction grating 26 includes the plurality of recesses 26*a* and the plurality of projections 26*b* that are alternately arranged and when the semiconductor device 30 having the ridge mesa structure is joined thereto, the overall light confinement coefficient of the joining portion is greater than or equal to 4%. Here, the overall light confinement coefficient is the average light confinement coefficient calculated from the light confinement coefficient on the cross section including each recess 26*a* and the light confinement coefficient on the cross section including each projection 26*b* in consideration of the proportions of lengths of the recesses 26*a* and the projections 26*b* in the X-axis direction (duty ratio of the diffraction grating).

Manufacturing Method

Two wafers, for example, are used to manufacture the semiconductor optical device 100. The two wafers are a wafer of an SOI substrate (substrate 10) and a III-V compound semiconductor wafer used to manufacture the semiconductor device 30.

The SOI substrate in the form of a wafer has a plurality of regions in each of which the semiconductor optical device 100 is to be formed. In each of the regions of the SOI substrate, the waveguides 20, the tapered portions 21, the grooves 22, the terraces 24, and the diffraction grating 26 illustrated in FIG. 2 are formed. A resist pattern is formed by, for example, electron-beam lithography to cover, with resist, areas where the waveguides 20, the tapered portions 21, the terraces 24, and the projections 26*b* of the diffraction grating 26 are to be formed. Portions of the Si layer 16 that are not covered with the resist and that are exposed are dry etched to form the grooves 22 and the recesses 26*a*. Portions protected by the resist serve as the waveguides 20, the tapered portions 21, the terraces 24, and the projections 26*b* (see FIG. 2).

Figure 5:
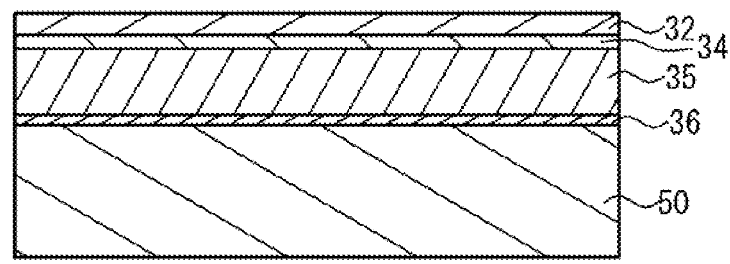
FIG. 5 is a sectional view illustrating a method for manufacturing the semiconductor device.
Figure 6A:
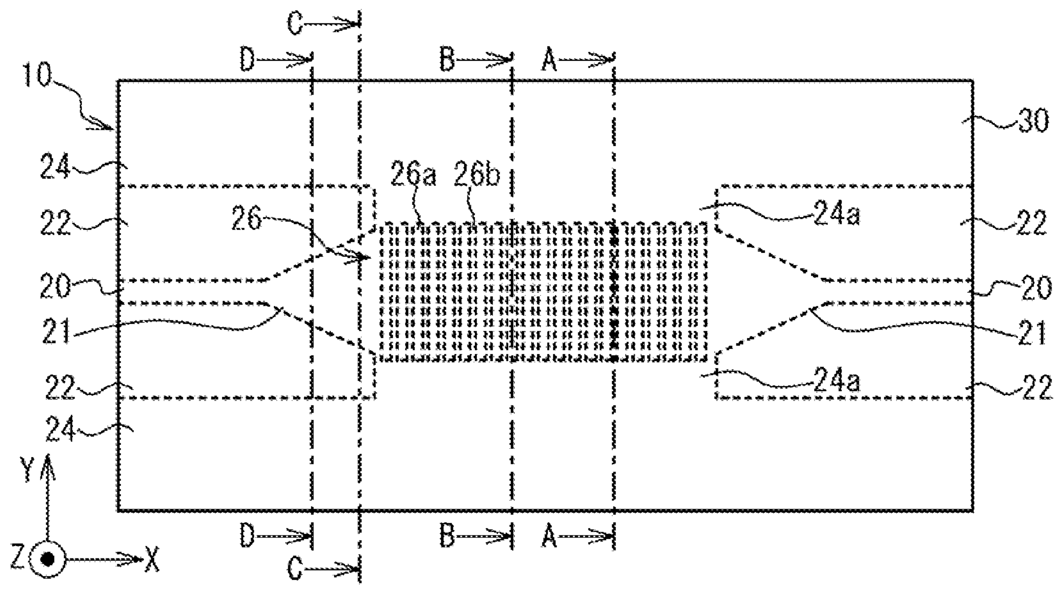
FIG. 6A is a plan view illustrating the method for manufacturing the semiconductor optical device.
Figure 6B:
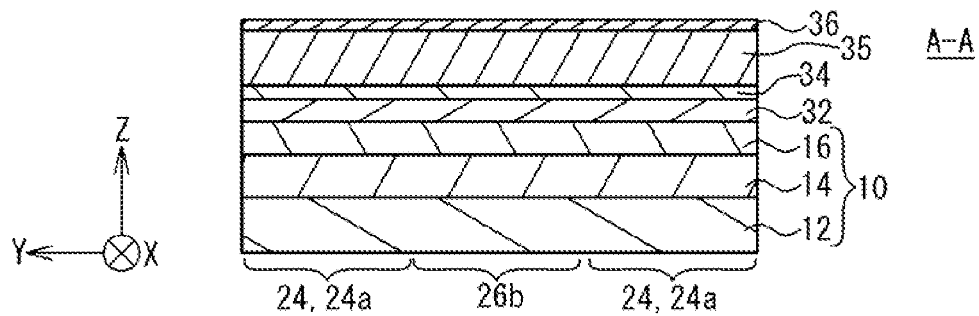
FIG. 6B is a sectional view of FIG. 6A taken along line A-A.
Figure 6C:
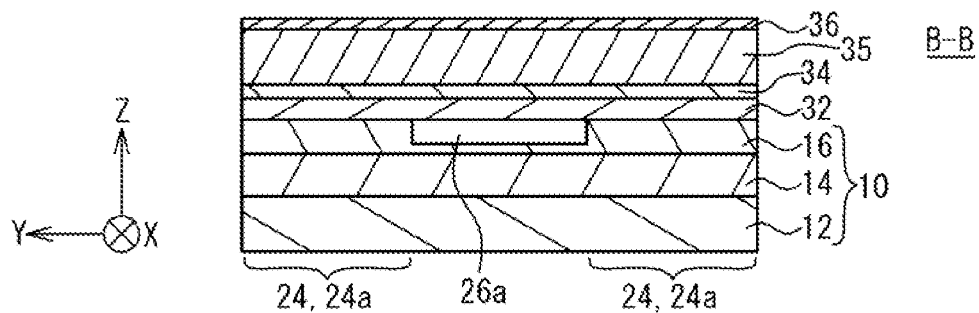
FIG. 6C is a sectional view of FIG. 6A taken along line B-B.
Figure 6D:
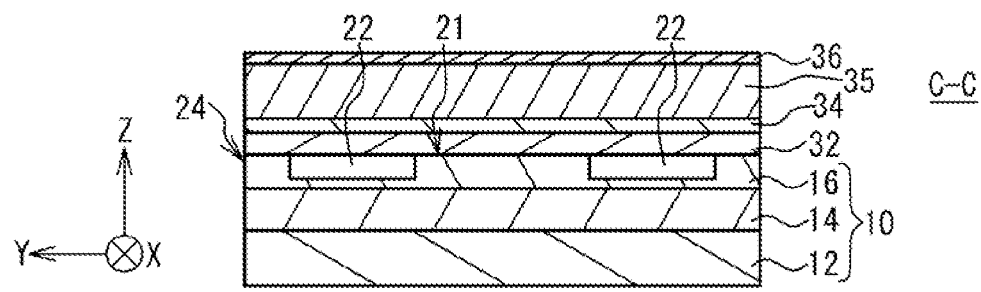
FIG. 6D is a sectional view of FIG. 6A taken along line C-C.
Figure 6E:
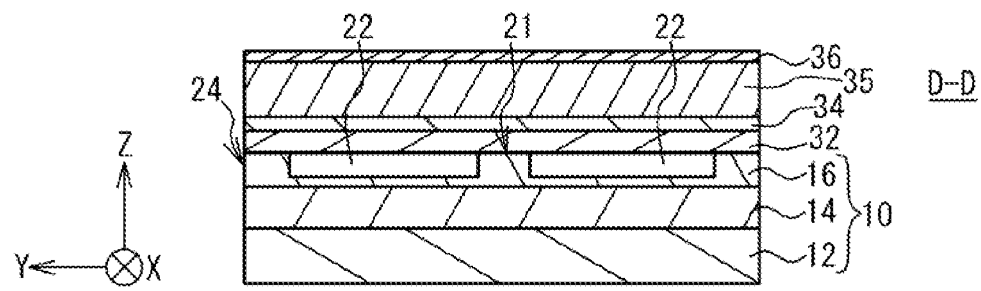
FIG. 6E is a sectional view of FIG. 6A taken along line D-D.
Figure 7A:
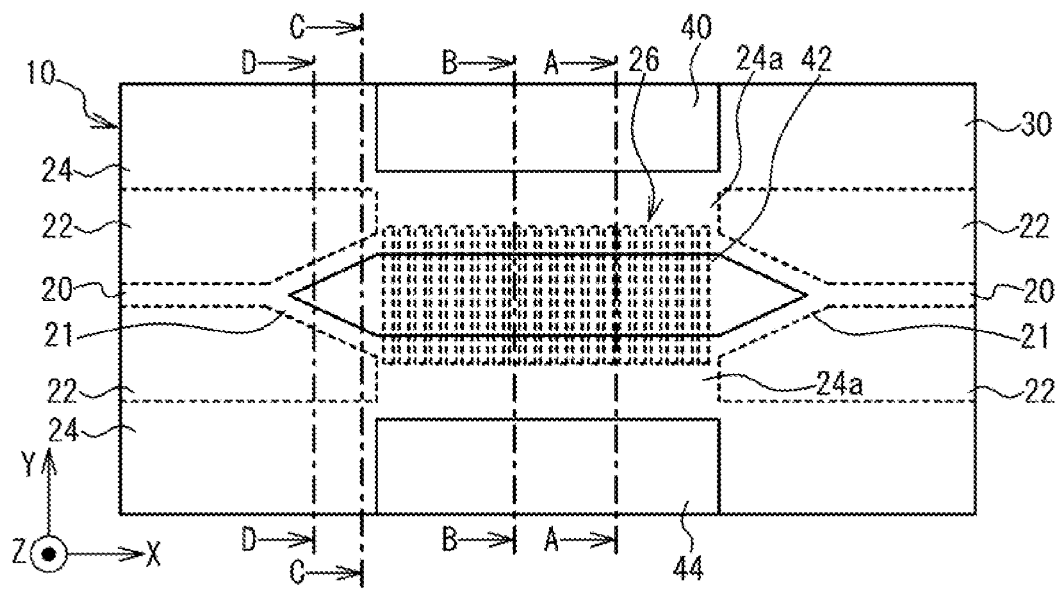
FIG. 7A is a plan view illustrating the method for manufacturing the semiconductor optical device.
Figure 7B:
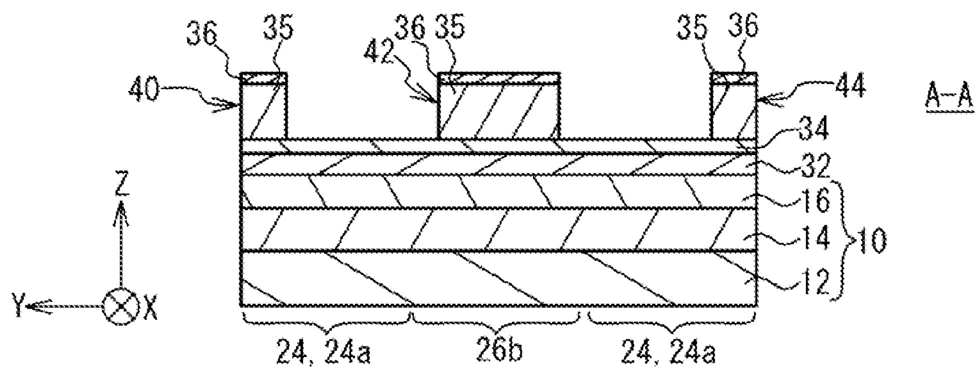
FIG. 7B is a sectional view of FIG. 7A taken along line A-A.
Figure 7C:
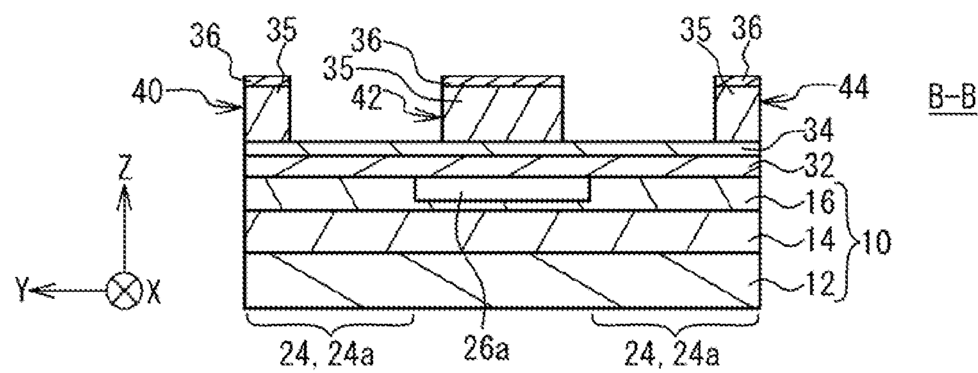
FIG. 7C is a sectional view of FIG. 7A taken along line B-B.
Figure 7D:
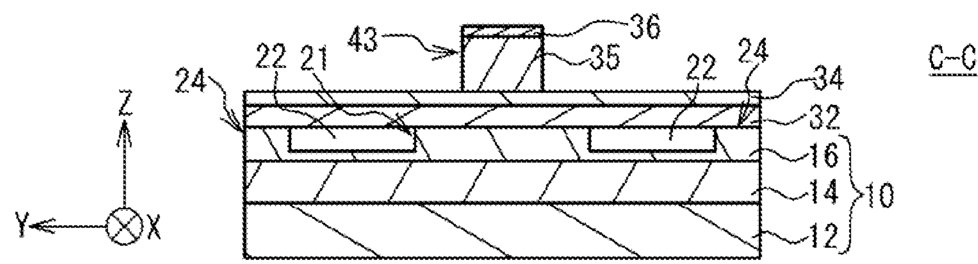
FIG. 7D is a sectional view of FIG. 7A taken along line C-C.
Figure 7E:
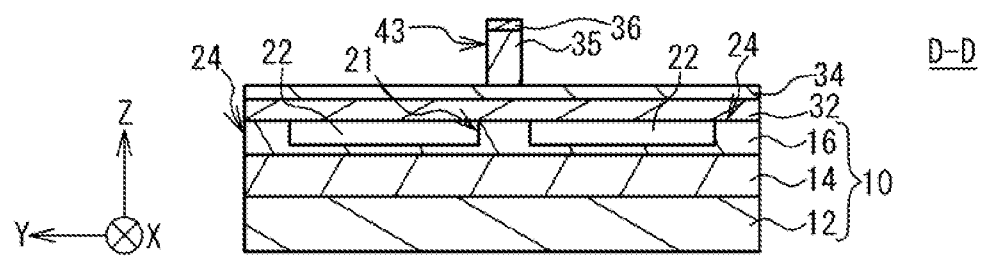
FIG. 7E is a sectional view of FIG. 7A taken along line D-D.

FIG. 5 is a sectional view illustrating a method for manufacturing the semiconductor device 30. For example, the contact layer 36, the cladding layer 35, the active layer 34, and the cladding layer 32 are epitaxially grown in that order on an InP substrate 50 by, for example, organometallic vapor phase epitaxy (OMVPE). Then, the wafer is diced to form a plurality of semiconductor devices 30. At the time when the wafer is diced, the mesas 40, 42, and 44, the electrodes, and the tapered portions 43 are not formed on each semiconductor device 30.

FIGS. 6A, 7A, 8A, and FIG. 9A are plan views illustrating the steps of the method for manufacturing the semiconductor optical device 100 that are performed after the semiconductor device 30 is joined to the substrate 10. FIGS. 6B, 7B, 8B, and 9B are sectional views of the respective plan views taken along line A-A. FIGS. 6C, 7C, 8C, and 9C are sectional views of the respective plan views taken along line B-B. FIGS. 6D, 7D, 8D, and 9D are sectional views of the respective plan views taken along line C-C. FIGS. 6E, 7E, 8E, and 9E are sectional views of the respective plan views taken along line D-D.

The surface of the cladding layer 32 of the semiconductor device 30 and the surface of the Si layer 16 of the substrate 10 are activated by, for example, irradiation with plasma. As illustrated in FIGS. 6A to 6E, the semiconductor device 30 is brought into contact with the Si layer 16 and joined to the upper surface of the substrate 10. The surface of the semiconductor device 30 and the upper surface of the substrate 10 are brought into contact with each other without an adhesive or the like provided therebetween. After the joining process, the substrate 50 on the semiconductor device 30 is removed by wet etching so that the surface of the contact layer 36 is exposed. The etchant used in the wet etching process flows into the grooves 22 in the substrate 10, but is blocked by the projections 26*b* of the diffraction grating 26 and the terraces 24. Etching of the lower surface of the semiconductor device 30 (cladding layer 32) is suppressed.

As illustrated in FIGS. 7A to 7E, the mesas 40, 42, and 44 are formed on the semiconductor device 30. An insulating film used to form a mask is formed on the surface of the semiconductor device 30, and a resist pattern is formed on the insulating film. The insulating film is dry etched by using the resist pattern to form an insulating film mask (not illustrated) having an opening. The resist pattern is removed. Portions of the contact layer 36 are exposed at the opening in the insulating film mask. The exposed portions of the semiconductor device 30 are dry etched so that the mesas 40, 42, and 44 are formed. Portions that are covered with the insulating film mask are not etched. After the etching process, the insulating film mask is removed.

Figure 8A:
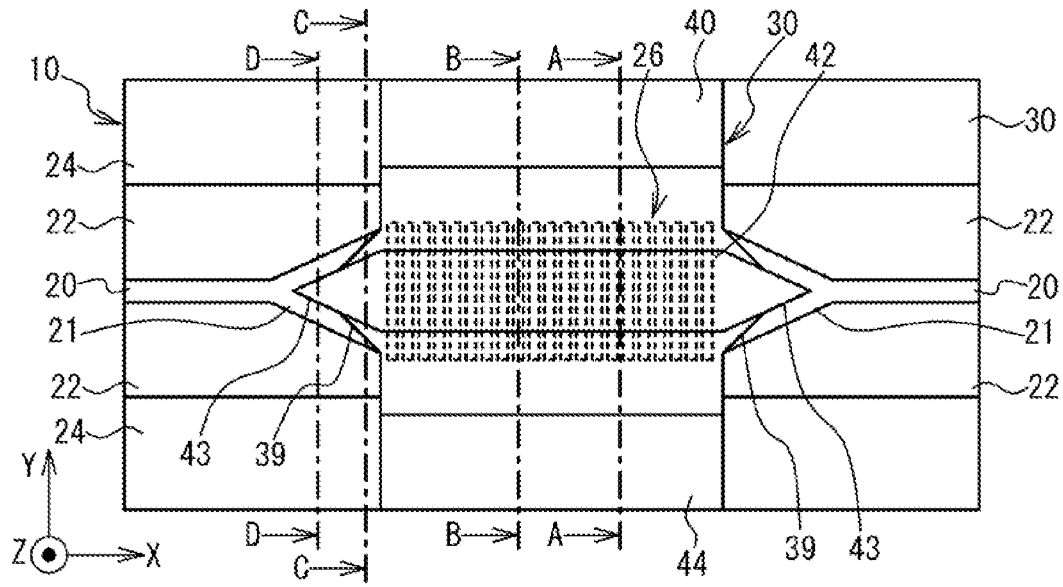
FIG. 8A is a plan view illustrating the method for manufacturing the semiconductor optical device.
Figure 8B:
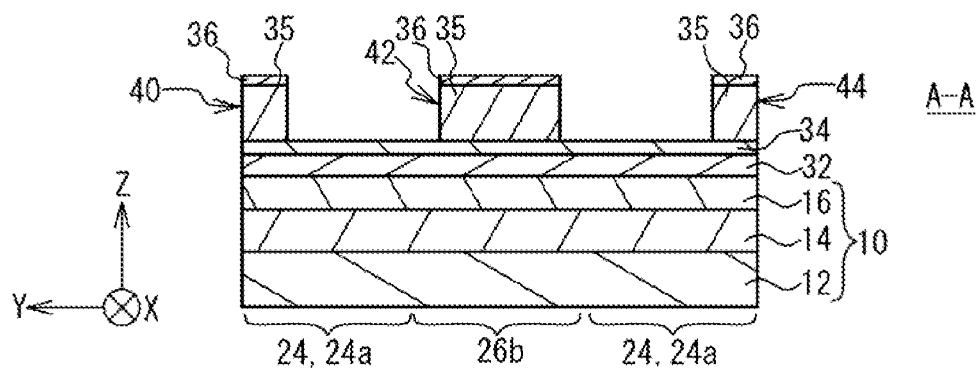
FIG. 8B is a sectional view of FIG. 8A taken along line A-A.
Figure 8C:
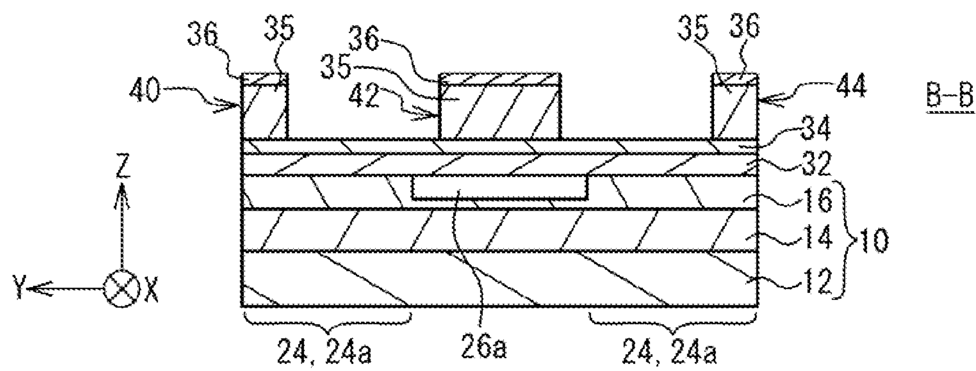
FIG. 8C is a sectional view of FIG. 8A taken along line B-B.
Figure 8D:
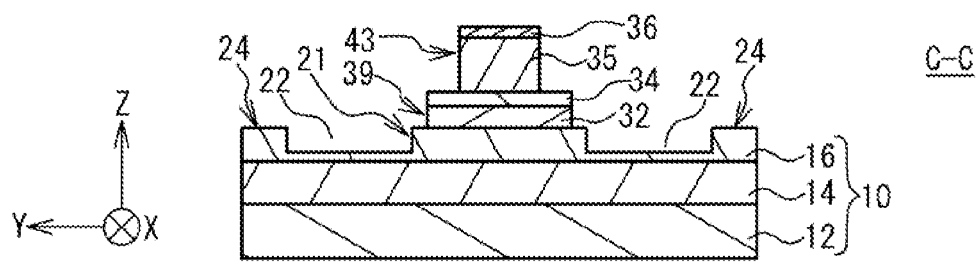
FIG. 8D is a sectional view of FIG. 8A taken along line C-C.
Figure 8E:
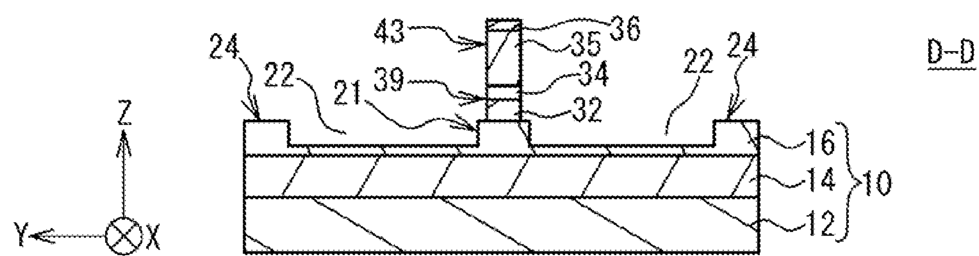
FIG. 8E is a sectional view of FIG. 8A taken along line D-D.
Figure 9A:
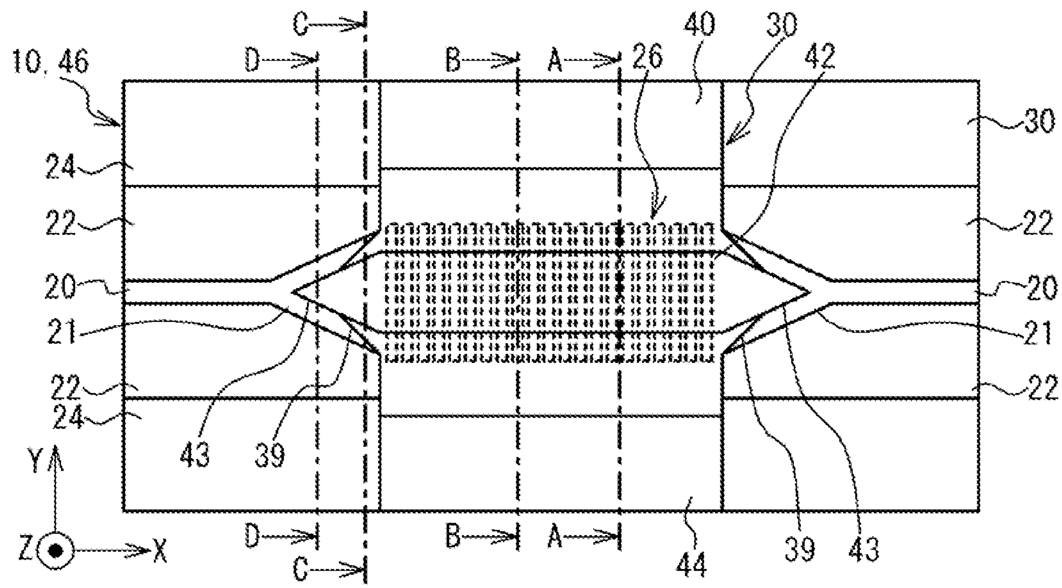
FIG. 9A is a plan view illustrating the method for manufacturing the semiconductor optical device.
Figure 9B:
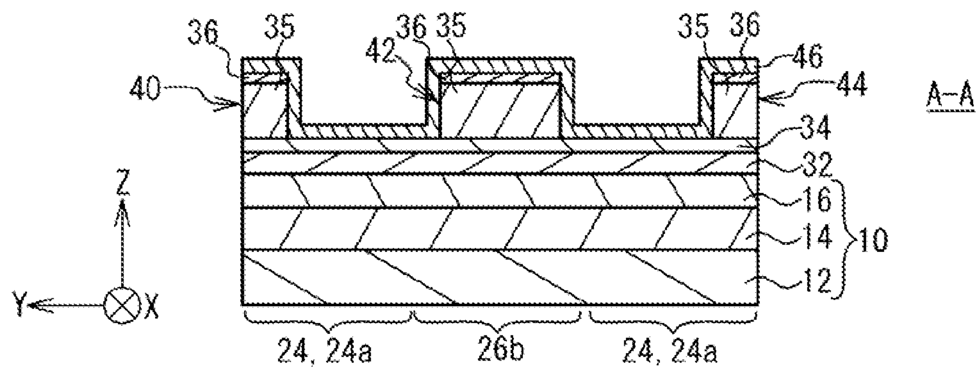
FIG. 9B is a sectional view of FIG. 9A taken along line A-A.
Figure 9C:
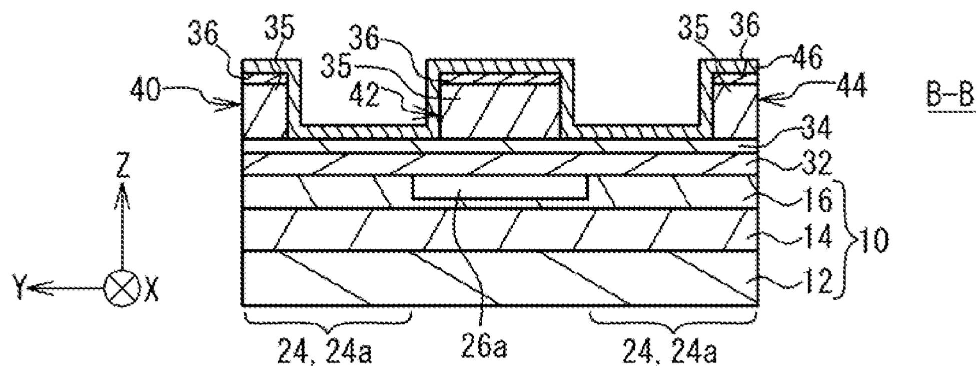
FIG. 9C is a sectional view of FIG. 9A taken along line B-B.
Figure 9D:
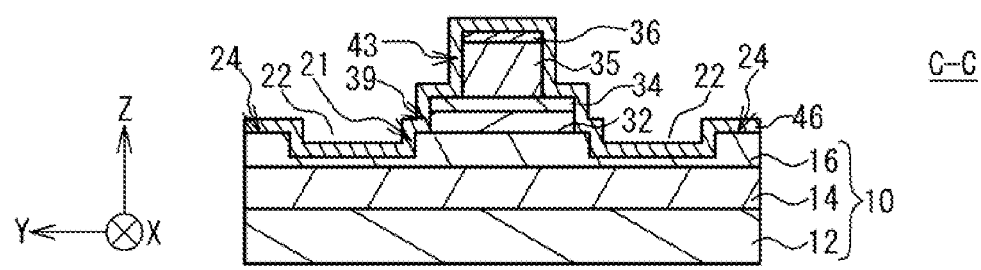
FIG. 9D is a sectional view of FIG. 9A taken along line C-C.
Figure 9E:
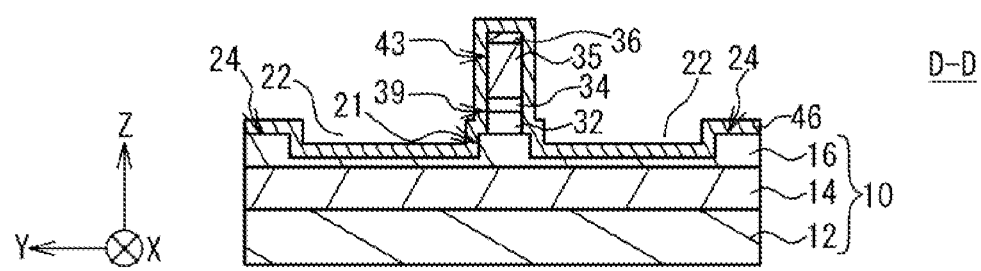
FIG. 9E is a sectional view of FIG. 9A taken along line D-D.

As illustrated in FIGS. 8A to 8E, the tapered portions 39 are formed on the semiconductor device 30. An insulating film used to form a mask is formed on the semiconductor device 30, and a resist pattern is formed on the insulating film. The insulating film is dry etched by using the resist pattern to form an insulating film mask (not illustrated). The resist pattern is removed. Portions of the active layer 34 are not covered by the insulating film mask and are exposed. The portions of the semiconductor device 30 that are not covered by the insulating film mask and that are exposed are dry etched to form the tapered portions 39. As illustrated in FIGS. 8B and 8C, the mesas 40, 42, and 44 and the portions between the mesas are not etched. As illustrated in FIGS. 8D and 8E, portions of the upper surface of the substrate 10 are exposed. The insulating film mask is removed.

As illustrated in FIGS. 9A to 9E, the insulating film 46 is formed on the surfaces of the substrate 10 and the semiconductor device 30 by, for example, chemical vapor deposition (CVD). Openings are formed in the insulating film 46 at a location above the mesa 42 and a location between the mesas 42 and 44, and the electrodes 38 and 37 illustrated in FIG. 1A and other figures are formed by, for example, vacuum deposition. The semiconductor optical device 100 illustrated in FIGS. 1A to 1E is manufactured by the above-described steps.

COMPARATIVE EXAMPLE

Figure 10A:
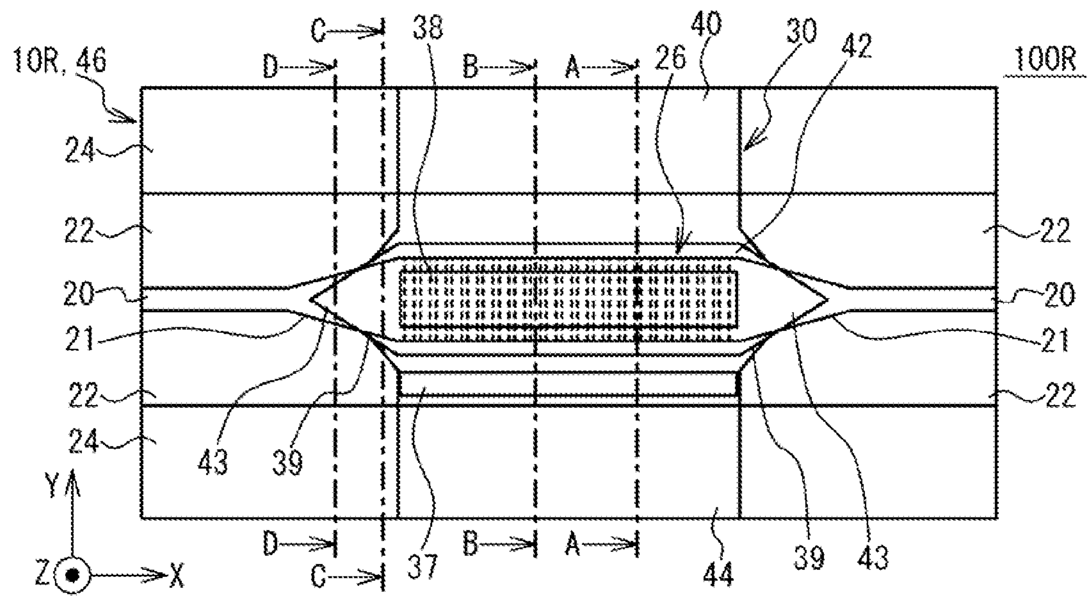
FIG. 10A is a plan view illustrating a semiconductor optical device according to a comparative example.
Figure 10B:
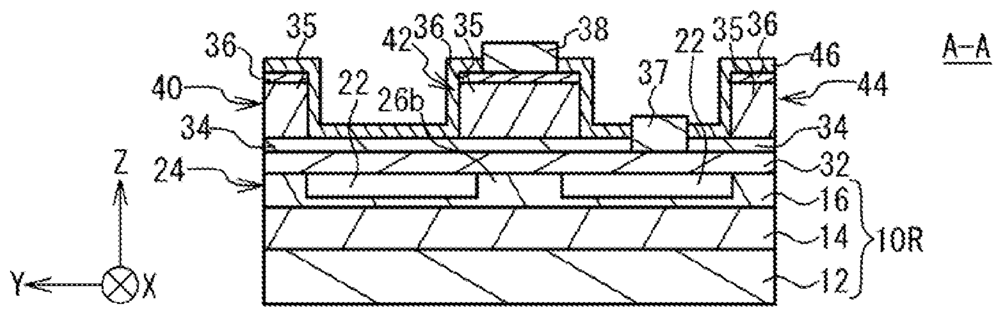
FIG. 10B is a sectional view of FIG. 10A taken along line A-A.
Figure 10C:
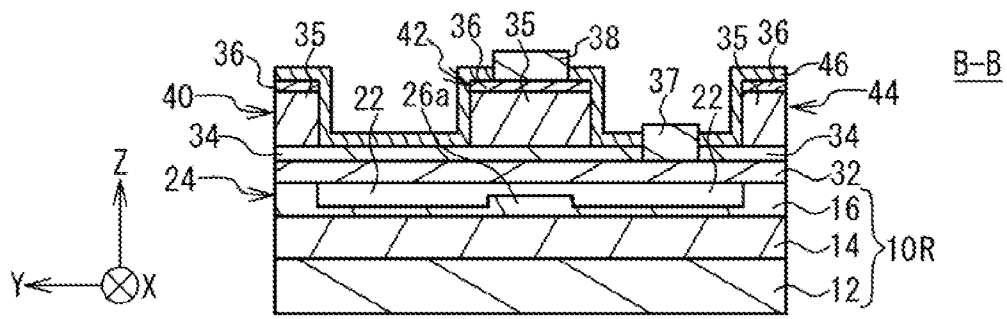
FIG. 10C is a sectional view of FIG. 10A taken along line B-B.
Figure 10D:
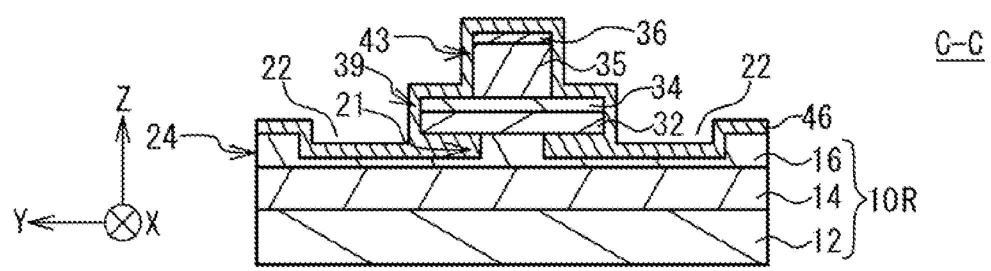
FIG. 10D is a sectional view of FIG. 10A taken along line C-C.
Figure 10E:
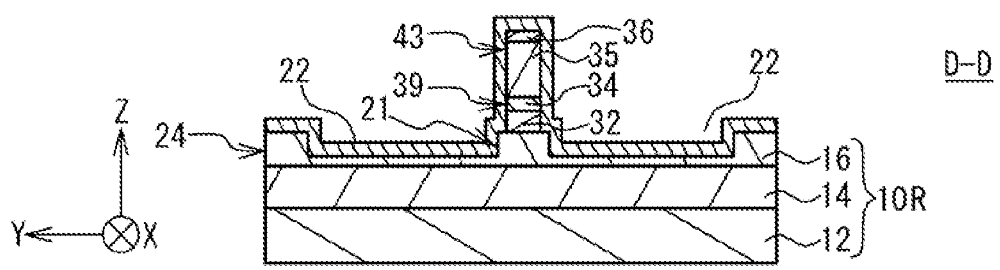
FIG. 10E is a sectional view of FIG. 10A taken along line D-D.
Figure 11:
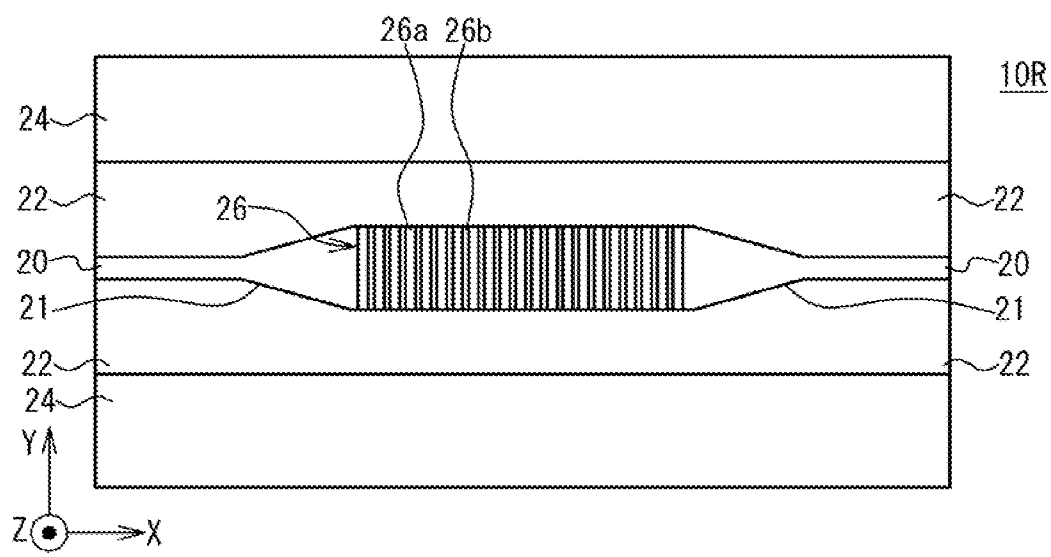
FIG. 11 is a plan view illustrating a substrate.

FIG. 10A is a plan view illustrating a semiconductor optical device 100R according to a comparative example. FIGS. 10B to 10E are sectional views of FIG. 10A taken along lines A-A, B-B, C-C, and D-D, respectively. FIG. 11 is a plan view illustrating a substrate 10R. The semiconductor optical device 100R includes the substrate 10R instead of the substrate 10.

As illustrated in FIG. 10A to FIG. 11, the substrate 10R has the grooves 22 on both sides of the diffraction grating 26. The terraces 24 have no protruding portions 24*a*, and are separated from the diffraction grating 26. The width of the grooves 22 is preferably increased to enhance the effect of confining light in the active layer 34 of the semiconductor device 30. However, since the grooves 22 are provided between the diffraction grating 26 and the terraces 24, the contact area between the semiconductor device 30 and the substrate 10R is reduced, and the joining strength is reduced accordingly.

In the comparative example, the inner surfaces of the grooves 22 that are not covered by the semiconductor device 30 are covered by the insulating film 46. The spaces inside the grooves 22 positioned below the semiconductor device 30 are filled with air. Since the thermal conductivity of air is less than the thermal conductivity of the substrate 10R, the thermal resistance is increased. The characteristics of the semiconductor optical device 100R are degraded due to a temperature increase during operation. During wet etching of the substrate on the semiconductor device 30, the etchant may enter the grooves 22 and etch the semiconductor device 30 from the bottom. Separation of the semiconductor device 30 easily occurs in the etching process.

According to the present embodiment, the substrate 10 includes the terraces 24, the diffraction grating 26, and the waveguides 20. As illustrated in FIG. 2, the grooves 22 are provided on both sides of the waveguides 20, so that light may be strongly confined in the waveguides 20. The grooves 22 are not provided on both sides of the diffraction grating 26. The diffraction grating 26 extends to the terraces 24 in the Y-axis direction and is connected to the terraces 24. The semiconductor device 30 is joined to the terraces 24 and the diffraction grating 26, and is in contact with the surface of the substrate 10. Since the contact area between the semiconductor device 30 and the substrate 10 is greater than that in the comparative example, the joining strength is increased.

As illustrated in FIGS. 1B to 1E, the lower surface of the semiconductor device 30 and the upper surface of the substrate 10 are in contact with each other without an adhesive or the like provided between the semiconductor device 30 and the substrate 10. The thermal resistance is reduced compared to the case where an adhesive made of a resin, for example, is used. In addition, since no grooves 22 are provided on both sides of the diffraction grating 26, the amount of air provided between the semiconductor device 30 and the substrate 10 is less than that in the comparative example, and the contact area between the semiconductor device 30 and the substrate 10 is increased. The thermal resistance is reduced, and heat generated during operation is effectively dissipated to the substrate 10. The temperature increase of the semiconductor device 30 is reduced, and the characteristics are improved. Since no grooves 22 are provided on both sides of the diffraction grating 26, when, for example, the substrate 50 illustrated in FIG. 5 is removed by wet etching, the etchant does not easily flow into the space below the semiconductor device 30. Etching of the semiconductor device 30 is suppressed, and separation of the semiconductor device 30 does not easily occur.

The waveguides 20, the terraces 24, and the diffraction grating 26 are formed on the Si layer 16 of the substrate 10. As illustrated in FIG. 2, the diffraction grating 26 includes the recesses 26*a* and the projections 26*b*. As illustrated in FIG. 1B, the projections 26*b* and the terraces 24 have the same height in the Z-axis direction and define the upper surface of the substrate 10. The semiconductor device 30 is in contact with the projections 26*b* and the terraces 24. Since the contact area between the semiconductor device 30 and the Si layer 16 of the substrate 10 is increased, the joining strength is increased, and the heat dissipation effect is enhanced. The bottom surfaces of the recesses 26*a* are preferably formed of the Si layer 16. Heat is conducted through the Si layer 16 and is dissipated.

The diffraction grating 26 includes the recesses 26*a* and the projections 26*b* that are periodically arranged. The wavelength of light may be adjusted in accordance with the arrangement period of the recesses 26*a* and the projections 26*b*. The recesses 26*a* and the projections 26*b* may be arranged uniformly as illustrated in FIG. 2. The diffraction grating 26 may include a plurality of partial diffraction gratings, for example, and function as a sampled grating-distributed bragg reflector (SG-DBR).

The protruding portions 24*a* of the terraces 24 illustrated in FIG. 2 protrude toward the diffraction grating 26 in the Y-axis direction. Since the protruding portions 24*a* are in contact with the semiconductor device 30, the joining strength is increased and the heat dissipation effect is enhanced. Since the protruding portions 24*a* block the etchant that flows into the grooves 22, etching of the semiconductor device 30 from the bottom is suppressed.

The semiconductor device 30 has the ridge mesa structure in which the mesa 42 is disposed above the diffraction grating 26 and in which the mesas 40 and 44 are disposed above the terraces 24. The electrode 38 is provided on the mesa 42. When a voltage is applied between the electrodes 37 and 38, light is emitted from a portion of the active layer 34 below the mesa 42. The light mode profile may be regulated by the mesa 42, and mode controllability is improved. The light confinement coefficient on the cross section including the recess 26*a* illustrated in FIG. 1C is 3.74%. The light confinement coefficient on the cross section including the projection 26*b* illustrated in FIG. 1B is 5.77%. The overall light confinement coefficient of the joining portion of the semiconductor device 30 is greater than or equal to 4%. Therefore, degradation of the characteristics is suppressed. The light confinement effect may be enhanced when the mesa 42 is disposed above the diffraction grating 26 of the semiconductor device 30, and it is not necessary that the mesas 40 and 44 be provided.

As the length of the protruding portions 24*a* of the terraces 24 increases, the contact area increases, and the joining strength can be increased accordingly. When the protruding portions 24*a* are long and the width W1 of the diffraction grating 26 is small, the effect of confining light in the semiconductor device 30 is reduced, and leakage of light to the substrate 10 may occur. The width W1 of the diffraction grating 26 is preferably greater than, for example, the width of the mesa 42 of the semiconductor device 30. For example, the width W1 of the diffraction grating 26 is preferably greater than or equal to twice the width of the mesa 42. Since the mesa 42 is separated from the terraces 24, the effect of confining light in the semiconductor device 30 is enhanced. Accordingly, leakage of light to the substrate 10 is reduced, and the mode profile can be controlled. When the width W1 of the diffraction grating 26 is large enough to block the grooves 22, it is not necessary that the terraces 24 include the protruding portions 24*a*.

As illustrated in FIGS. 1A and 2, the Si layer 16 of the substrate 10 includes the tapered portions 21. Each tapered portion 21 has a width that decreases with increasing distance from the diffraction grating 26 in a direction away from the diffraction grating 26. The tapered portions 21 serve to reduce light loss by reducing reflection of light between the diffraction grating 26 and the waveguides 20.

As illustrated in FIG. 1A, the semiconductor device 30 includes the tapered portions 43 having a width that decreases with increasing distance from the diffraction grating 26 in a direction toward the waveguides 20. The tapered portions 43 serve to reduce light loss by enhancing the optical coupling between the semiconductor device 30 and the waveguides 20.

Although an embodiment of the present disclosure has been described in detail, the present disclosure is not limited to a specific embodiment, and various modifications and alterations are possible within the gist of the present disclosure described in the claims.

What is claimed is:

1. A semiconductor optical device comprising:

a substrate containing silicon and including terraces, a waveguide, and a diffraction grating in different regions in plan view; and a semiconductor device formed of a III-V compound semiconductor and having an optical gain includes a first cladding layer, an active layer, and a second cladding layer that are stacked in that order from the substrate and further includes a first mesa, the semiconductor device being joined to the diffraction grating and the terraces, and being in contact with an upper surface of the substrate, wherein the first mesa is provided above the diffraction grating, projects in a direction away from the substrate, and includes a portion of the second cladding layer, the waveguide is optically coupled to the diffraction grating in a first direction, which is a direction in which the waveguide extends, the terraces are located on both sides of the waveguide and the diffraction grating in a direction crossing the first direction, the substrate has a groove between each of the terraces and the waveguide, the diffraction grating is continuously connected to the terraces in the direction crossing the first direction, and the diffraction grating has a width greater than a width of the first mesa in the direction crossing the first direction.

2. The semiconductor optical device according to claim 1, wherein the substrate includes a silicon layer, wherein the terraces, the waveguide, and the diffraction grating are provided on or in the silicon layer, wherein the diffraction grating includes recesses and projections that are provided on or in the silicon layer and arranged periodically in the first direction, and wherein upper surfaces of the terraces and upper surfaces of the projections of the diffraction grating form a plane.

3. The semiconductor optical device according to claim 1, wherein the semiconductor device includes second mesas that are provided above the terraces of the substrate and that project in the direction away from the substrate, wherein each second mesa includes a portion of the second cladding layer and is separated from the first mesa, and wherein the semiconductor device includes a first electrode that is electrically connected to the first cladding layer and a second electrode that is electrically connected to the portion of the second cladding layer included in the first mesa.

4. The semiconductor optical device according to claim 1, wherein the terraces include protruding portions that protrude toward the diffraction grating, and wherein the diffraction grating is connected to the protruding portions.

5. The semiconductor optical device according to claim 1, wherein the waveguide includes a first tapered portion having a width that decreases with increasing distance from the diffraction grating in a direction away from the diffraction grating.

6. The semiconductor optical device according to claim 1, wherein the semiconductor device includes a second tapered portion having a width that decreases with increasing distance from the diffraction grating in a direction toward the waveguide.

7. A method for manufacturing a semiconductor optical device, the method comprising the steps of:

preparing a substrate containing silicon and having terraces, a waveguide, and a diffraction grating formed thereon in different regions in plan view; and joining a semiconductor device formed of a III-V compound semiconductor and having an optical gain to the diffraction grating and the terraces on the substrate, and the semiconductor device includes a first cladding layer, an active layer, and a second cladding layer that are stacked in that order from the substrate, and further including a first mesa, the first mesa is provided above the diffraction grating, projects in a direction away from the substrate, and includes a portion of the second cladding layer, wherein the joining of the semiconductor device is performed such that the semiconductor device comes into contact with an upper surface of the substrate, the waveguide is optically coupled to the diffraction grating in a first direction, which is a direction in which the waveguide extends, the terraces are located on both sides of the waveguide and the diffraction grating in a direction crossing the first direction, the substrate has a groove between each of the terraces and the waveguide, the diffraction grating is continuously connected to the terraces in the direction crossing the first direction, and the diffraction grating has a width greater than a width of the first mesa in the direction crossing the first direction.

8. A semiconductor optical device comprising:

a substrate containing silicon and including terraces, a waveguide, and a diffraction grating in different regions in plan view; and a semiconductor device formed of a III-V compound semiconductor and having an optical gain, includes a first cladding layer, an active layer and a second cladding layer that are stacked in that order from the substrate, a first mesa, second mesas, a first electrode, and a second electrode the semiconductor device being joined to the diffraction grating and the terraces, and being in contact with an upper surface of the substrate, wherein the first mesa is provided above the diffraction grating, projects in a direction away from the substrate, and includes a portion of the second cladding layer, the second mesas are provided above the terraces and project in the direction away from the substrate, each second mesa includes a portion of the second cladding layer and is separated from the first mesa, the first electrode is electrically connected to the first cladding layer and the second electrode is electrically connected to a portion of the second cladding layer included in the first mesa, the waveguide is optically coupled to the diffraction grating in a first direction, which is a direction in which the waveguide extends, the terraces are located on both sides of the waveguide and the diffraction grating in a direction crossing the first direction, the substrate has a groove between each of the terraces and the waveguide, and the diffraction grating is continuously connected to the terraces in the direction crossing the first direction.

* * * * *